(12) United States Patent
Schaller et al.

(10) Patent No.: US 7,110,115 B2
(45) Date of Patent: Sep. 19, 2006

(54) METHOD AND ARRANGEMENT FOR ALIGNING AN OPTICAL COMPONENT ON A PRINTED WIRING BOARD

(75) Inventors: Andreas Schaller, Wiesbaden (DE); Thorsten Machande, Flensburg (DE)

(73) Assignee: Motorola, Inc., Schaumburg, IL (US)

( * ) Notice: Subject to any disclaimer, the term of this patent is extended or adjusted under 35 U.S.C. 154(b) by 407 days.

(21) Appl. No.: 10/609,855

(22) Filed: Jun. 30, 2003

(65) Prior Publication Data

US 2004/0263845 A1  Dec. 30, 2004

(51) Int. Cl.
  *G01B 11/00* (2006.01)
(52) U.S. Cl. .................................................. 356/399
(58) Field of Classification Search ............ None
  See application file for complete search history.

(56) References Cited

U.S. PATENT DOCUMENTS 4,686,565 A * 8/1987 Ando ........................ 348/126
5,408,189 A * 4/1995 Swart et al. .............. 324/758
5,640,199 A * 6/1997 Garakani et al. ........... 348/87
5,699,448 A * 12/1997 Gorenflo et al. ............ 382/151
5,752,446 A * 5/1998 Squibb ...................... 101/486
5,943,089 A * 8/1999 Douglas ...................... 348/87
6,044,549 A   4/2000 Kubin

FOREIGN PATENT DOCUMENTS

EP   0 798 576 A2   3/1996

* cited by examiner

*Primary Examiner*—Hwa (Andrew) Lee
*Assistant Examiner*—Gordon J. Stock, Jr.

(57) ABSTRACT

A method and arrangement for aligning an optical component (14) on a printed wiring board (1) by using a reflector (8) below a surface mount technology camera to determine the offset ($\Delta$) between the printed wiring board electrical layout and the light beam in the printed wiring board optical layer.

6 Claims, 2 Drawing Sheets

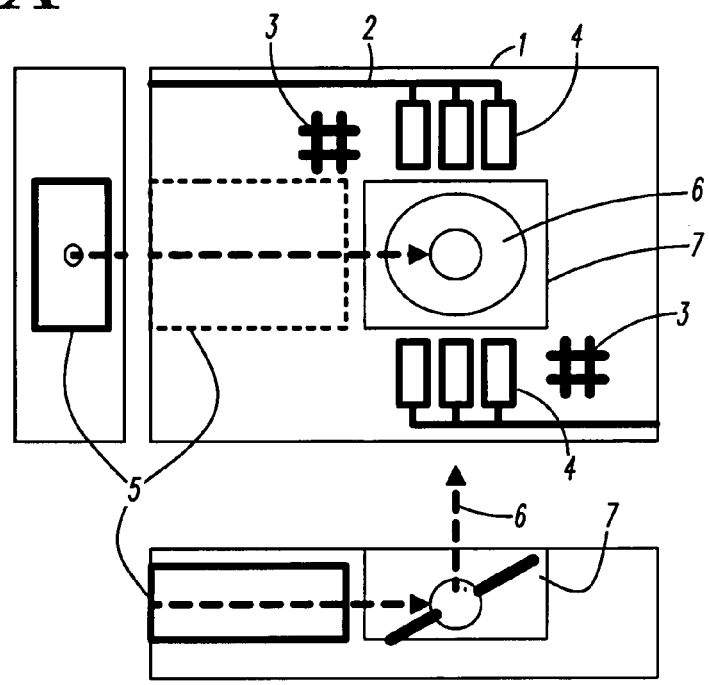
FIG. 1A
FIG. 1B
FIG. 1C
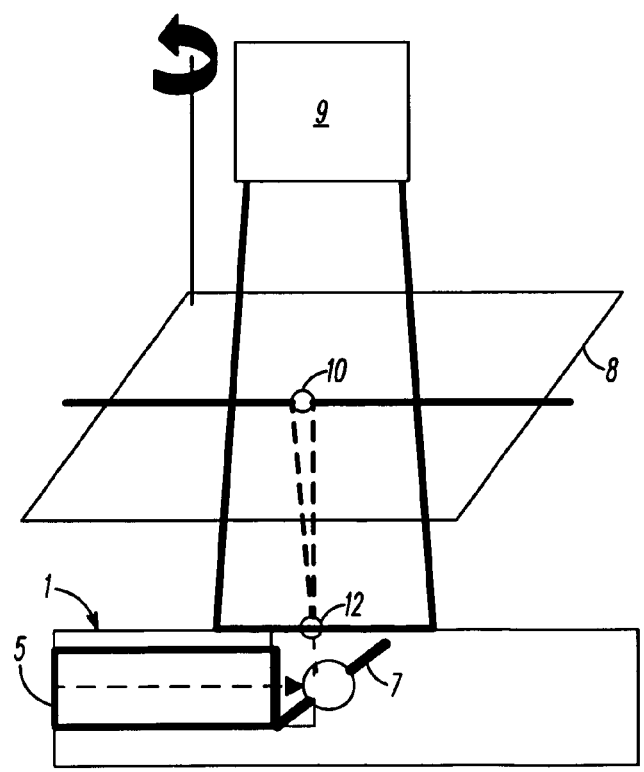
FIG. 2

METHOD AND ARRANGEMENT FOR ALIGNING AN OPTICAL COMPONENT ON A PRINTED WIRING BOARD

FIELD OF THE INVENTION

This invention relates to opto/electronic assemblies.

BACKGROUND OF THE INVENTION

In the field of this invention it is known that assembly of optical components in opto/electronic arrangements is done manually or with slow semi-automatic machines. One of the reasons for this is that there is no fast automatic way for aligning an active optical component to the electrical layout and to the laser light beam of the optical omponent.

From U.S. Pat. No. 6,044,549 there is known the manufacture of printed circuit board structures which include a substrate (i.e., a printed circuit board) and electronic components mounted upon the substrate for automatic assembly of the components onto the substrate; components need to be positioned substantially exactly in their required location to ensure the terminals on the components are aligned correctly with terminal pads on the substrate, to which they are to be soldered. For this purpose, registration datum positions are provided upon a substrate. The datum positions, or origins or zeros of reference, are referred to in the printed circuit board manufacturing industry as "fiducials". The terminal pads, upon which the terminals of the components are to be placed, are exposed through windows of a solder mask covering the substrate surface. The fiducials are represented by metal pads which are also exposed through windows of the solder mask with clearance being provided between the pads and edges of the windows. Thus, the peripheral edges of the metal pads are identified by the control equipment to set the fiducial position. Fiducial position is in a desired and known location with reference to the terminal pads on the substrate, with which the terminals of the electronic components need to be aligned. However, slight misalignments are known to occur between the position of the solder mask on the one hand, and the fiducials and terminal pads on the printed circuit board on the other hand. This may not cause a problem with windows of large size, but some windows are only slightly larger than the terminal pads which are exposed within them. This occurs when there is small terminal spacing, such as for terminal connections of chip or ball grid arrays to substrate terminal pads, and the margin for misalignment error becomes much smaller. In such cases, it is not unknown for edges of windows to interfere and prevent correct terminal placement upon terminal pads, thereby providing defective printed circuit board structures.

From European Patent EP 0,798,576 there is known an optical element with alignment marking. The optical element, e.g. a laser, has a waveguide and an alignment marking allowing accurate optical adjustment of the optical element relative to a carrier. The alignment marking is etched in a waveguide layer packet in the same etching step as the waveguide. The alignment marking is masked by a dielectric layer to prevent it being covered by the cover layer for the waveguide, or alternatively the cover layer is etched from the surface of the alignment marking via a selective etching process. This known method provides passive alignment to an optical layer but no adjustment to mirror misalignment.

Additionally, these known approaches have the disadvantage of providing no alignment to optical layer and mirror.

A need therefore exists for aligning an optical component on a printed wiring board wherein the abovementioned disadvantage(s) may be alleviated.

It will be understood that, as used herein, the term "printed wiring board" or "PWB" is not limited to any particular technology and is intended to cover any board, layer or other substrate having formed thereon or therein interconnections for interconnecting components mounted to the substrate (for example, a printed circuit board).

STATEMENT OF INVENTION

In accordance with a first aspect of the present invention there is provided a method for aligning an optical component on a printed wiring board as claimed in claim 1.

Briefly stated, in a preferred embodiment of the invention an optical component is aligned on a printed wiring board by using a reflector below a surface mount technology camera to determine offset between the printed wiring board electrical layout and a light beam in the printed wiring board optical layer.

BRIEF DESCRIPTION OF THE DRAWINGS

One method and arrangement for aligning an optical component on a printed wiring board incorporating the present invention will now be described, by way of example only, with reference to the accompanying drawings, in which:

FIG. 1A, FIG. 1B and FIG. 1C show schematic side, top and front views respectively of an opto/electronic printed wiring board (PWB);

FIG. 2 shows a schematic diagram of an arrangement used in assembly of an optical component to the PWB of FIG. 1.

DESCRIPTION OF PREFERRED EMBODIMENT(S)

Figure 3:
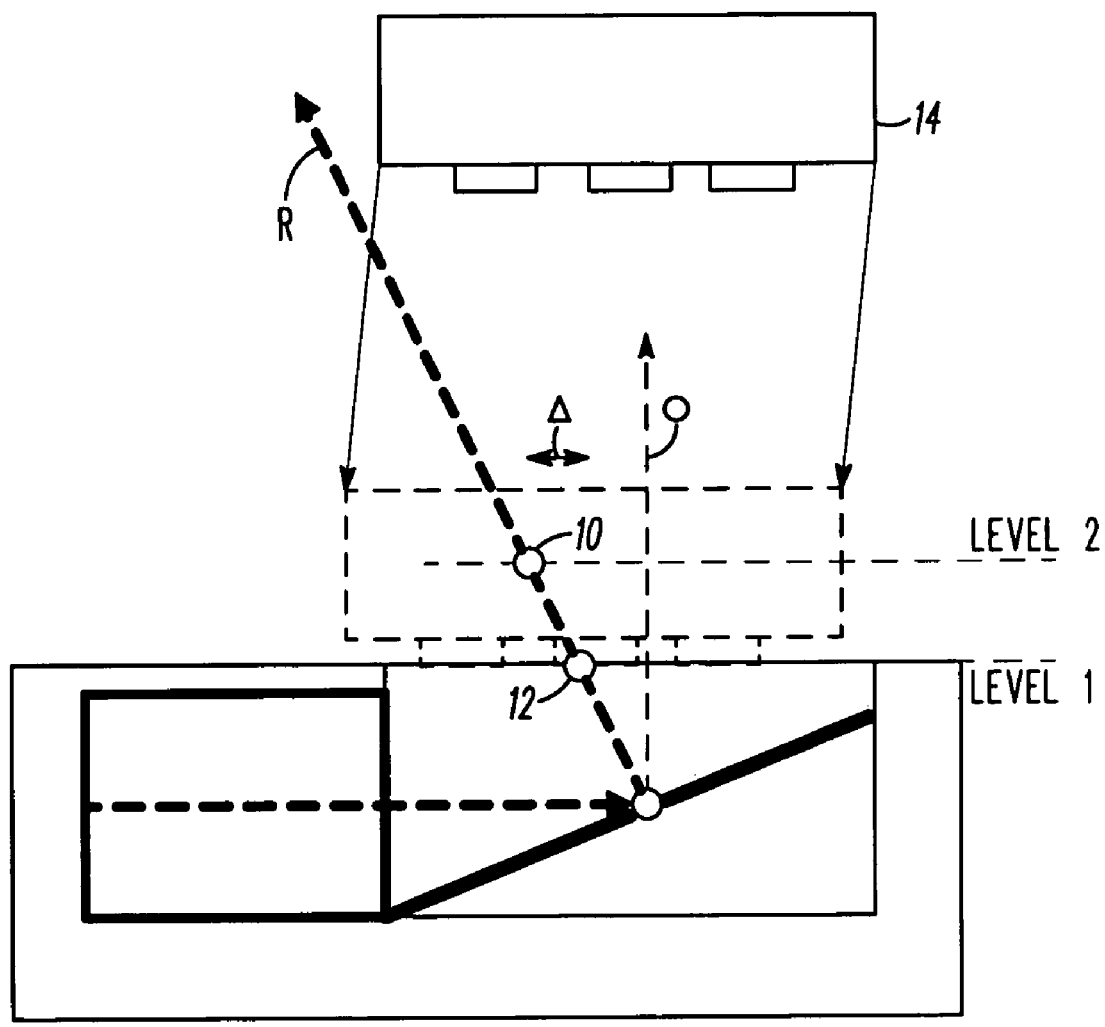
FIG. 3 shows an enlarged view of assembly of the optical component to the PWB of FIG. 1 using the arrangement of FIG. 2.

Referring firstly to FIG. 1, a PWB (1) has on its upper surface (hereafter referred to as level 1) an electrical layout made out of copper traces in conventional manner. This layout consists out of copper lines (2), pads (3) and a number of fiducials (4) of which two sets are shown. The PWB additionally has an underlying optical layer, which is built up out of embedded waveguides (5). Light beams (6) of different wavelength can run through this optical waveguide. To guide a light beam into an optical detector, which is to be mounted on the top of the PWB it is necessary to redirect the light beam using an embedded mirror (7). For assembly of the detector on the top of the PWB it is necessary to place the component exactly aligned to the electrical layout and to the light beam (6). A standard approach (for example, that described in the previously discussed U.S. Pat. No. 6,044,549) is used to align the detector component to the electrical layout of the PWB using the defined fiducials (4) with the aid of a camera, which will be described in greater detail below. Afterwards light will be sent through the optical waveguides (5), which will be reflected by the mirror (7).

Referring now also to FIG. 2, to detect the light path in the same coordinate system as used for alignment to the electrical layout via the defined fiducials (4), a translucent reflective layer (8) is put into the light path at a position (hereafter referred to as level 2), between the camera (9) and the electrical layout of the PWB corresponding to the intended operational position of the optical detector component when assembled on the PWB. The light will be reflected by the reflective layer (8) and the position of the reflection (10) can be detected (because of the translucency of the reflective layer (8)) by the same camera (9), referred to above, as used to align components to the electrical layer. The position (10), with coordinates $x_2, y_2$ as seen from the camera (9), will typically be different to the position (12), with coordinates $x_1, y_1$ as seen from the camera (9), at level 1 detected by the camera without the reflective layer (8).

Referring now also to FIG. 3, the detected light beam position (10) is then used to derive a mismatch correction ($\Delta$) with respect to the detected light beam at position (12) at level 1. It will be appreciated that this mismatch arises because the real light beam direction (R) after reflection at the embedded mirror (7) is typically different to the optimal light beam (O). The mismatch correction ($\Delta$) is applied to placement of the optical detector (14) during its assembly on the electrical layer at level 1 using conventional surface mount technology (SMT), thus aligning the detector component with respect to the light beam and the electrical layer.

It will be appreciated that the alignment scheme described above:

allows fast insertion and removal of the reflection layer into the light beam;

is usable for different multi-mode optical layouts; and permits use of vision camera sub-pixel algorithms for higher position accuracy.

It will further be appreciated that although the invention has been described above in relation to the electrical layout and the optical detector being provided in different overlying layers, they could alternatively be provided in different parts in the same layer.

It will further be appreciated that although the invention has been described above in relation to alignment of an optical detector on a printed wiring board, the invention could alternatively be applied to alignment of any other optical component such as an optical transmitter.

It will be understood that the method described above for aligning an optical components on a PWB provides the following advantages:

Component alignment to optical layer and component alignment to mirror reflection Fast placement process for optical components Flexible process because there is no need for component specific fixtures Compatible to standard SMT processes Compatible with standard SMT placement machines.

The invention claimed is:

1. A method for aligning an optical component on a printed wiring board, comprising:
    providing an opto/electronic printed wiring board having a part including an electrical layout,
        at least one embedded optical waveguide for carrying a light beam between a position remote from the board and a component to be mounted on the board, and
        an embedded mirror positioned in the path of the beam for reflecting the beam;
    providing a camera for detecting light reflected by the mirror in proximity to a desired location on the board for placement of the optical component,
    positioning a reflective layer between the camera and the part;
    detecting a position on the reflective layer at which light is reflected; and
    aligning the optical component on the part in accordance with the position detected on the reflective layer.

2. The method of claim 1 wherein the method further includes detecting light at a position on the part; and
    the step of aligning comprises
        determining a mismatch between the position detected on the part and the position detected on the reflective layer, and
        aligning the optical component on the part in accordance with the detected mismatch.

3. The method of claim 1 wherein the part comprises a layer.

4. The method of claim 1 wherein the electrical layout includes at least one fiducial and the method further includes using the camera to align the electrical layout via the at least one fiducial.

5. The method of claim 1 wherein the optical component comprises an optical detector.

6. The method of claim 1 wherein the method further comprises mounting the optical component on the part by surface mount technology.

* * * * *